US012674554B1

(12) United States Patent
Johnson et al.

(10) Patent No.: US 12,674,554 B1
(45) Date of Patent: Jul. 7, 2026

(54) CIRCUIT BOARD HAVING CONCAVE RIBBON BONDS

(71) Applicant: Ford Global Technologies, LLC, Dearborn, MI (US)

(72) Inventors: Aaron Bradley Johnson, Allen Park, MI (US); Segundo Baldovino, Novi, MI (US); Michael Robertson, West Bloomfield, MI (US); Ketan K. Desai, Farmington Hills, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 0 days.

(21) Appl. No.: 19/227,877

(22) Filed: Jun. 4, 2025

(51) Int. Cl.
| | |
|---|---|
| *F21S 41/19* | (2018.01) |
| *F21S 41/151* | (2018.01) |
| *F21S 45/47* | (2018.01) |
| *F21S 45/49* | (2018.01) |
| *H05K 1/181* | (2026.01) |
| *F21Y 103/10* | (2016.01) |
| *F21Y 115/10* | (2016.01) |

(52) U.S. Cl.
CPC ........... *F21S 41/192* (2018.01); *F21S 41/151* (2018.01); *F21S 45/47* (2018.01); *F21S 45/49* (2018.01); *H05K 1/181* (2013.01); *F21Y 2103/10* (2016.08); *F21Y 2115/10* (2016.08); *H05K 2201/0382* (2013.01); *H05K 2201/066* (2013.01); *H05K 2201/10106* (2013.01); *H05K 2201/1053* (2013.01); *H05K 2201/2045* (2013.01)

(58) Field of Classification Search
CPC ...... F21S 41/192; F21S 41/151; H05K 1/181; H05K 2201/0382; H05K 2201/1053; H05K 2201/2045
See application file for complete search history.

(56) References Cited

U.S. PATENT DOCUMENTS

| | | | |
|---|---|---|---|
| 5,508,888 | A | 4/1996 | Craps |
| 5,901,048 | A | 5/1999 | Hu |
| 6,541,872 | B1 | 4/2003 | Schrock et al. |
| 8,198,138 | B2 | 6/2012 | Moden |
| 8,558,386 | B2 | 10/2013 | Fjelstad et al. |

(Continued)

FOREIGN PATENT DOCUMENTS

| | | |
|---|---|---|
| CN | 2731765 Y | 10/2005 |
| CN | 202140826 U | 2/2012 |

(Continued)

OTHER PUBLICATIONS

English translation of Yun KR-20250001948-A (Year: 2025).*
English translation of Qiu CN-119050086 (Year: 2024).*

*Primary Examiner* — Evan P Dzierzynski
(74) *Attorney, Agent, or Firm* — Vichit Chea; Price Heneveld LLP

(57) ABSTRACT

A circuit board assembly has a circuit board with a mounting surface, first and second circuit components mounted on the circuit mounting surface, and first and second concave ribbon bonds extending between the first and second circuit components. The first and second ribbon bonds each have a first end connected to the first circuit component, a second end connected to the second circuit component and a concave portion extending between the first and second ends.

17 Claims, 3 Drawing Sheets

(56)             References Cited

U.S. PATENT DOCUMENTS

| | | | | |
|---|---|---|---|---|
| 2010/0046221 A1* | 2/2010 | Posselt | ...................... | F21K 9/00 |
| | | | | 362/249.02 |
| 2014/0369657 A1* | 12/2014 | Hurley | ................. | G02B 6/4246 |
| | | | | 29/428 |
| 2018/0283665 A1* | 10/2018 | Roth | ........................ | F21S 45/47 |
| 2023/0025975 A1* | 1/2023 | Feng | .................... | F21V 23/003 |
| 2023/0163502 A1* | 5/2023 | Lau | ........................ | H01R 24/60 |
| | | | | 439/495 |
| 2025/0294938 A1* | 9/2025 | Giese | .................. | H10H 20/857 |

FOREIGN PATENT DOCUMENTS

| | | | | | |
|---|---|---|---|---|---|
| CN | 119050086 A | * | 11/2024 | ............... | H05K 3/34 |
| JP | 2008078180 A | | 4/2008 | | |
| JP | 5685187 B2 | | 3/2015 | | |
| KR | 20250001948 A | * | 1/2025 | ........... | F21V 23/001 |

* cited by examiner

CIRCUIT BOARD HAVING CONCAVE RIBBON BONDS

FIELD OF THE DISCLOSURE

The present disclosure generally relates to circuit component interconnections on a circuit board, and more particularly relates to a circuit board having ribbon bonds connecting electrical circuit components.

BACKGROUND OF THE DISCLOSURE

Circuit board components are commonly connected together with ribbon bonds that form electrical paths to interconnect electrical circuitry. Ribbon bonds may extend from circuitry on one circuit component on top of the circuit board to connect to another circuit board component. For example, vehicle headlamps may employ a light emitting diode (LED) chip that may be connected to an electrical connector component via first and second ribbon bonds to supply the electrical power to power an LED lamp. It would be desirable to provide for a circuit board arrangement that prevents or reduces contact with the ribbon bonds during assembly and use.

SUMMARY OF THE DISCLOSURE

According to a first aspect of the present disclosure, a circuit board assembly includes a circuit board having a circuit mounting surface, a first circuit component mounted on the circuit mounting surface, a second circuit component mounted on the circuit mounting surface, and a first concave ribbon bond extending between the first and second circuit components. The first ribbon bond has a first end connected to the first circuit component, a second end connected to the second circuit component and a concave portion extending downward between the first and second ends of the first ribbon bond.

Embodiments of the first aspect of the present disclosure can include any one or a combination of the following features:
- the first concave ribbon bond extends below a top surface of the first circuit component and a top surface of the second circuit component;
- a second concave ribbon bond extends between the first and second circuit components, the second ribbon bond having a first end connected to the first circuit component and a second end connected to the second circuit component and a concave portion extending downward between the first and second ends of the second ribbon bond;
- the second concave ribbon bond extends below the top surface of the first circuit component and the top surface of the second circuit component;
- the first circuit component comprises a light emitting diode (LED) chip;
- the LED chip is provided in a vehicle headlamp;
- the first component comprises one or more of a diode, a capacitor, an inductor and an LED chip;
- the second component comprises an electrical connector module;
- the first and second ends of the first and second ribbon bonds are each connected with a solder connection;
- the circuit board comprises a printed circuit board; and
- a heat sink is thermally coupled to the printed circuit board.

According to a second aspect of the present disclosure, a vehicle lighting device has a lamp housing and a circuit board assembly disposed in the lamp housing. The circuit board assembly includes a circuit board having a circuit mounting surface, a first circuit component comprising an LED chip mounted on the circuit mounting surface, a second circuit component mounted on the circuit mounting surface and a first concave ribbon bond extending between the first and second circuit components. The first ribbon bond has a first end connected to the first circuit component, a second end connected to the second circuit component and a concave portion extending downward between the first and second ends of the first ribbon bond. A second concave ribbon bond extends between the first and second circuit components, the second ribbon bond having a first end connected to the first circuit component and a second end connected to the second circuit component and a concave portion extending downward between the first and second ends of the second ribbon bond.

Embodiments of the second aspect of the present disclosure can include any one or a combination of the following features:
- the first concave ribbon bond extends below a top surface of the first circuit component and a top surface of the second circuit component;
- the second concave ribbon bond extends below the top surface of the first circuit component and the top surface of the second circuit component;
- the first circuit component comprises a light emitting diode (LED) chip;
- the LED chip is provided in a vehicle headlamp;
- the first component comprises one or more of a diode, a capacitor, an inductor and an LED chip;
- the second component comprises an electrical connector module;
- the circuit board comprises a printed circuit board; and
- a heat sink thermally is coupled to the printed circuit board.

These and other features, advantages, and objects of the present disclosure will be further understood and appreciated by those skilled in the art by reference to the following specification, claims, and appended drawings.

DETAILED DESCRIPTION OF PREFERRED EMBODIMENTS

Figure 1:
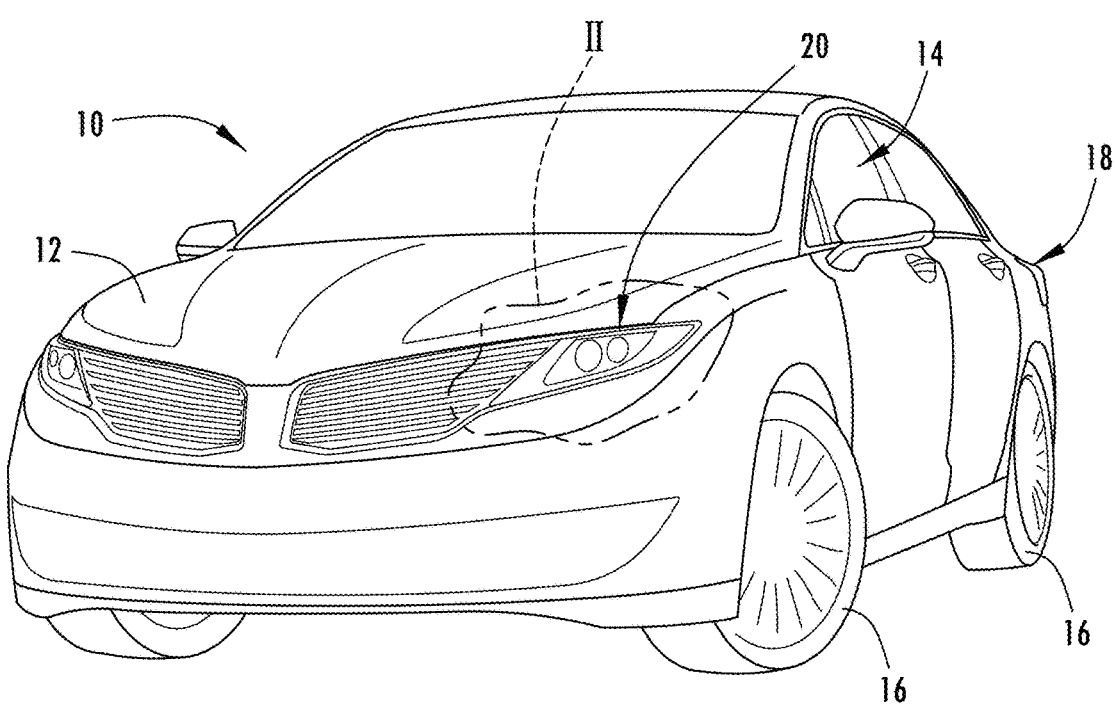
FIG. 1 is a front perspective view of a motor vehicle having exterior light assemblies including a pair of headlamps.

Reference will now be made in detail to the present preferred embodiments of the disclosure, examples of which are illustrated in the accompanying drawings. Wherever possible, the same reference numerals will be used throughout the drawings to refer to the same or like parts. In the drawings, the depicted structural elements are not to scale and certain components are enlarged relative to the other components for purposes of emphasis and understanding.

As required, detailed embodiments of the present disclosure are disclosed herein; however, it is to be understood that the disclosed embodiments are merely exemplary of the disclosure that may be embodied in various and alternative forms. The figures are not necessarily to a detailed design; some schematics may be exaggerated or minimized to show function overview. Therefore, specific structural and functional details disclosed herein are not to be interpreted as limiting, but merely as a representative basis for teaching one skilled in the art to variously employ the present disclosure.

For purposes of description herein, the terms "upper," "lower," "right," "left," "rear," "front," "vertical," "horizontal," and derivatives thereof shall relate to the concepts as oriented in FIG. 1. However, it is to be understood that the concepts may assume various alternative orientations, except where expressly specified to the contrary. It is also to be understood that the specific devices and processes illustrated in the attached drawings, and described in the following specification are simply exemplary embodiments of the inventive concepts defined in the appended claims. Hence, specific dimensions and other physical characteristics relating to the embodiments disclosed herein are not to be considered as limiting, unless the claims expressly state otherwise.

The present illustrated embodiments reside primarily in combinations of method steps and apparatus components related to a circuit board and vehicle lighting device. Accordingly, the apparatus components and method steps have been represented, where appropriate, by conventional symbols in the drawings, showing only those specific details that are pertinent to understanding the embodiments of the present disclosure so as not to obscure the disclosure with details that will be readily apparent to those of ordinary skill in the art having the benefit of the description herein. Further, like numerals in the description and drawings represent like elements.

As used herein, the term "and/or," when used in a list of two or more items, means that any one of the listed items can be employed by itself, or any combination of two or more of the listed items, can be employed. For example, if a composition is described as containing components A, B, and/or C, the composition can contain A alone; B alone; C alone; A and B in combination; A and C in combination; B and C in combination; or A, B, and C in combination.

In this document, relational terms, such as first and second, top and bottom, and the like, are used solely to distinguish one entity or action from another entity or action, without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises . . . a" does not, without more constraints, preclude the existence of additional identical elements in the process, method, article, or apparatus that comprises the element.

As used herein, the term "about" means that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art. When the term "about" is used in describing a value or an end-point of a range, the disclosure should be understood to include the specific value or end-point referred to. Whether or not a numerical value or end-point of a range in the specification recites "about," the numerical value or end-point of a range is intended to include two embodiments: one modified by "about," and one not modified by "about." It will be further understood that the end-points of each of the ranges are significant both in relation to the other end-point, and independently of the other end-point.

The terms "substantial," "substantially," and variations thereof as used herein are intended to note that a described feature is equal or approximately equal to a value or description. For example, a "substantially planar" surface is intended to denote a surface that is planar or approximately planar. Moreover, "substantially" is intended to denote that two values are equal or approximately equal. In some embodiments, "substantially" may denote values within about 10% of each other, such as within about 5% of each other, or within about 2% of each other.

As used herein the terms "the," "a," or "an," mean "at least one," and should not be limited to "only one" unless explicitly indicated to the contrary. Thus, for example, reference to "a component" includes embodiments having two or more such components unless the context clearly indicates otherwise.

Referring to FIGS. 1-5, a circuit board assembly 30 is generally shown assembled on a headlamp assembly 20 on a motor vehicle 10. The circuit board assembly 30 has a circuit board 32 with a mounting surface 34, a first circuit component 36 mounted on the circuit mounting surface 34 and a second circuit component 40 mounted on the circuit mounting surface 34. The circuit board assembly 30 has a first ribbon bond 50 extending between the first and second circuit components 36 and 40, the first ribbon bond 50 having a first end connected to the first circuit component 36, a second end connected to the second circuit component 40 and a concave portion between the first and second ends. The circuit board assembly 30 may also have a second ribbon bond 52 extending between the first and second circuit components 36 and 40, the second ribbon bond 52 having a first end connected to the first circuit component 36, a second end connected to the second circuit component 40 and a concave portion between the first and second ends.

The motor vehicle 10 is shown in FIG. 1 as a wheeled automotive vehicle configured as a sedan, according to one example. The motor vehicle 10 generally includes a vehicle body 12 defining a cabin interior 14. The cabin interior 14 typically includes an arrangement of vehicle seating assemblies, driver controls and other accessories. The vehicle body 12 typically includes a plurality of body panels including moveable closure panels such as doors, a trunk and a hood, and may include various fascia such as trim panels and exterior lighting assemblies. The motor vehicle 10 is shown as a wheeled vehicle having a plurality of tire and wheel assemblies 16. The motor vehicle 10 may otherwise be configured in other configurations such as a sport utility vehicle (SUV), a truck, a van or a bus, for example, or other styles of motor vehicles having a circuit board with interconnected circuit components.

The motor vehicle 10 is configured with exterior lighting assemblies which include a pair of taillamp assemblies 18 located on opposite rear end corners of the motor vehicle 10 and a pair of headlamp assemblies 20 located on opposite front end corners of the motor vehicle 10. Each of the headlamp assemblies 20 and taillamp assemblies 18 are equipped with light sources which, in one example, are configured in the form of light emitting diodes (LEDs) that provide vehicle lighting such as lighting for one or more of high and low beam headlamp lights, turn signal lights, flasher lights, fog lights, side marker lights, daytime running lights, tail lights and reverse lights, for example. The motor vehicle 10 may include other exterior lighting assemblies such as a center high mount stop lamp (CHMSL), for example, and may include interior lighting assemblies that have a circuit board with interconnected circuit components.

Figure 2:
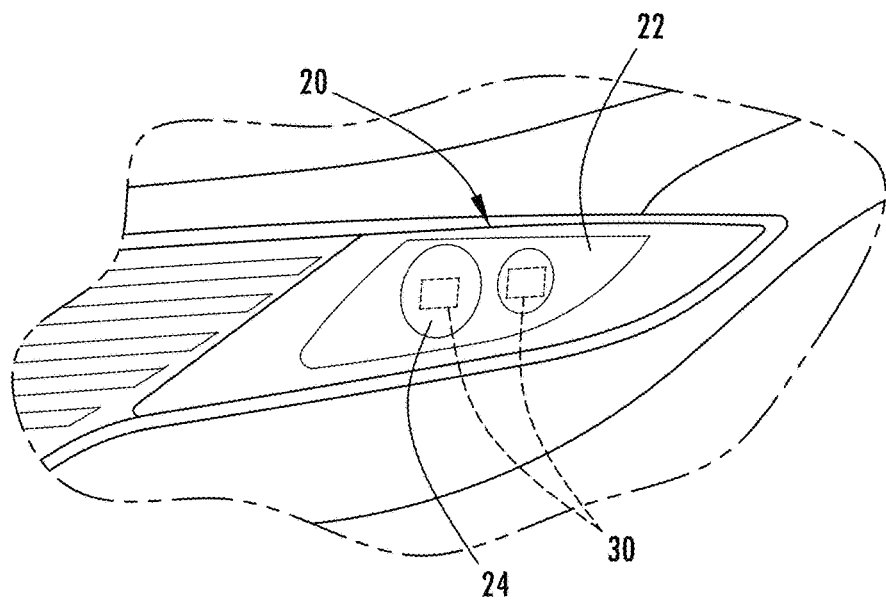
FIG. 2 is an enlarged view of section II of FIG. 1 illustrating one of the headlamps equipped with LED circuit boards, according to one example.

Referring to FIG. 2, one of the headlamp assemblies 20 is illustrated at the front end corner of the motor vehicle 10. The headlamp assembly 20 generally includes a lamp housing 22 which may include a clear light transmissive lens 24 that is generally configured in a sealed, enclosed arrangement housing one or more circuit board assemblies 30 with one or more LED chips having one or more LEDs that serve as light sources to illuminate light forward of the motor vehicle 10 through the lens 24. The clear light transmissive lens 24 may extend along the front end and a side portion so that light is emitted from the front end and a side portion. The headlamp assembly 20 includes one or more circuit board assemblies 30 assembled within the housing 22 and may include a circuit board for each LED chip or may include multiple LED chips for providing one or more light sources. It should be appreciated that separate circuit board assemblies 30 and LED chips may be employed for separate light illuminations such as light illuminating from separate lamp mounting chambers within the housing 22. The taillamp assembly 18 may likewise include a housing 22 having a clear light transmissive lens 24 and one or more circuit board assemblies 30 with a circuit board with interconnected circuit components, similar to the headlamp assembly 20.

Figure 3:
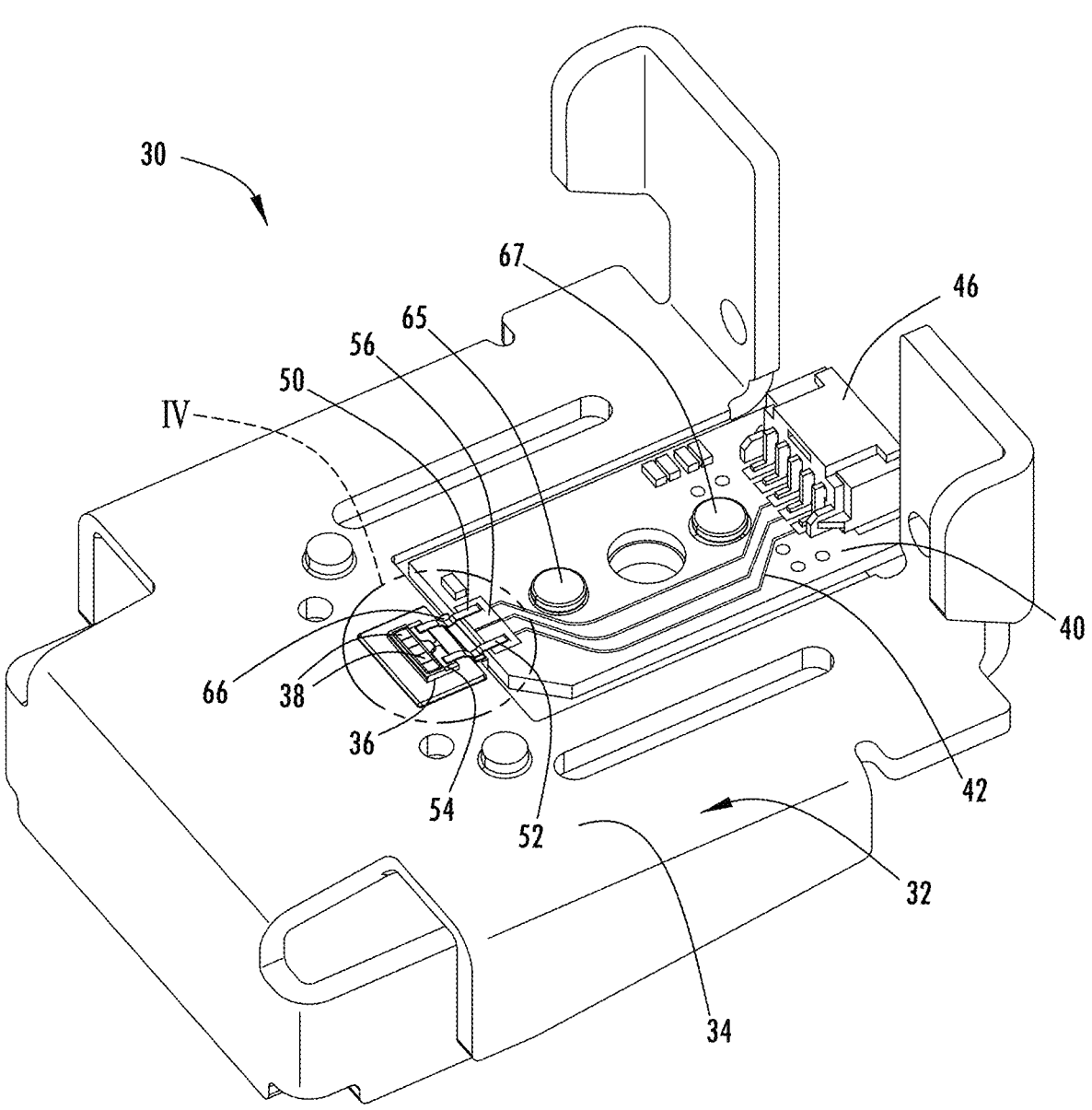
FIG. 3 is an upper respective view of a circuit board employed in the headlamp and having concave ribbon bonds, according to one embodiment.
Figure 4:
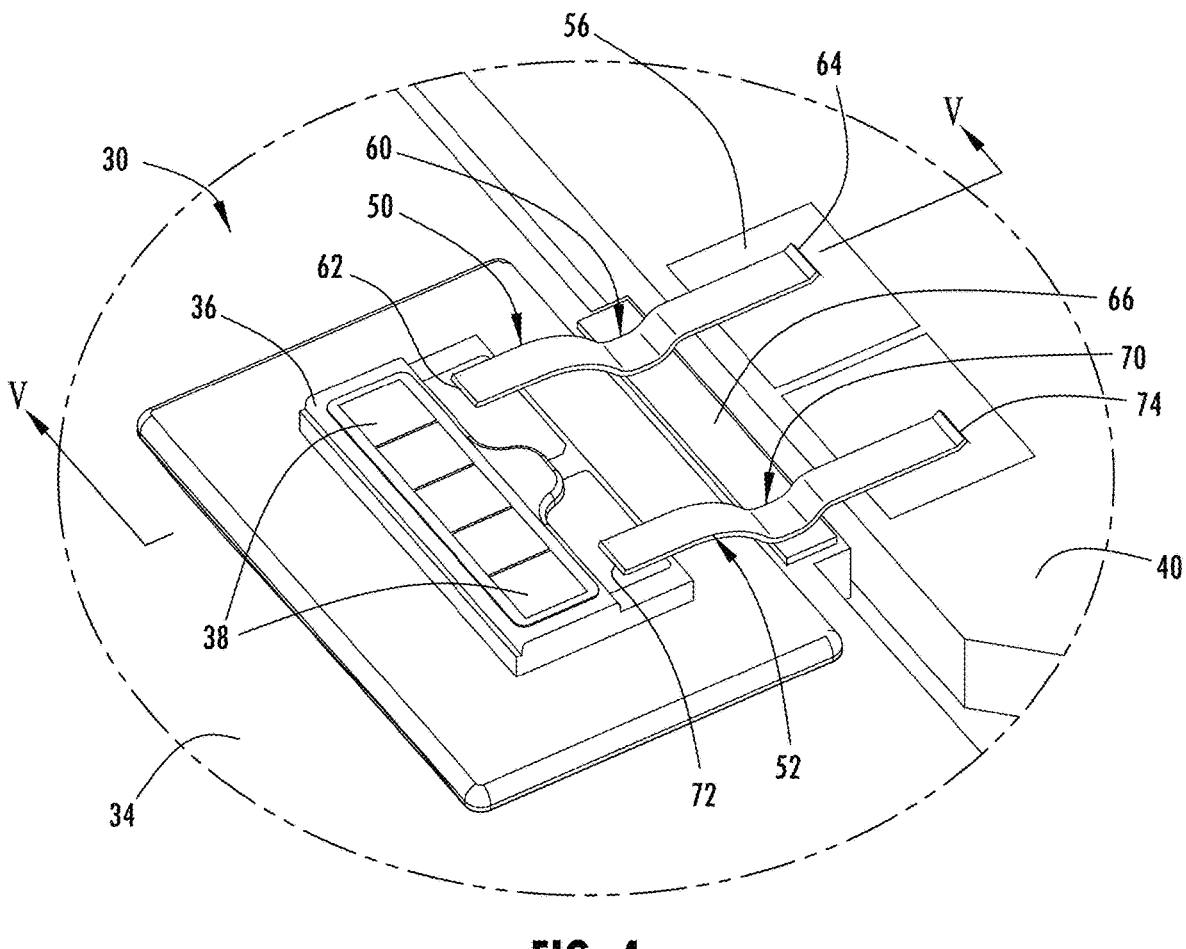
FIG. 4 is an enlarged view of section IV taken from FIG. 3 illustrating the circuit board and a pair of ribbon bonds connecting the circuit components.
Figure 5:
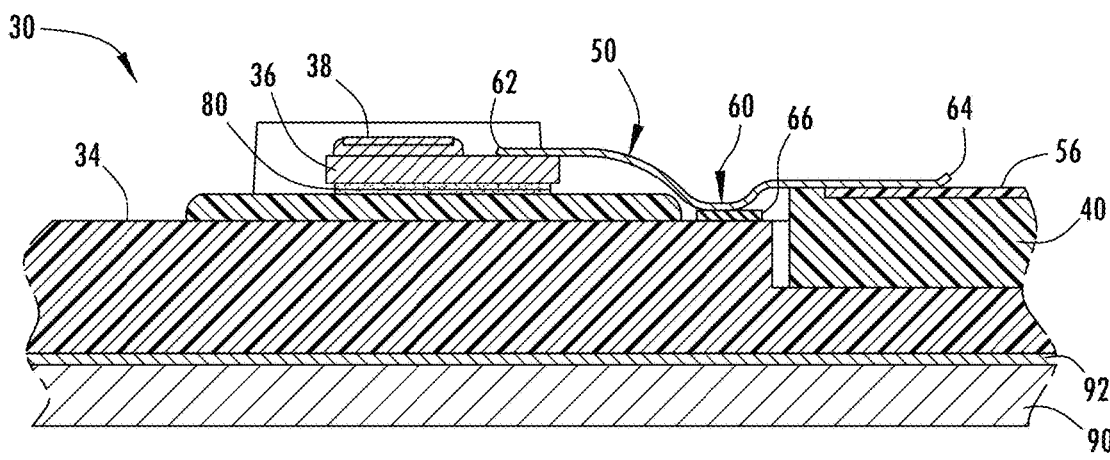
FIG. 5 is a cross-sectional view of the circuit board and ribbon bonds taken through line V-V of FIG. 4.

One exemplary embodiment of the circuit board assembly 30 is illustrated in FIGS. 3-5. The circuit board assembly 30 is generally shown in FIG. 5 having the circuit board 32 supported on top of a heat sink 90. The heat sink 90 may include an aluminum block or other thermally conductive material for dissipating heat. The circuit board 32 may be a printed circuit board (PCB) and may be connected to the top surface of the heat sink 90 via a thermal paste 92 that conducts thermal energy away from the circuit board 32 and into the heat sink 90 for dissipation into the surrounding environment. The circuit board 32 is generally planar on top which provides for a circuit mounting surface 34 for mounting circuit components.

The circuit board assembly 30 is illustrated in one example having circuit components mounted on the circuit mounting surface 34 of the circuit board 32 including a first circuit component 36 and a second circuit component 40. The first circuit component 36 is shown and described herein as an LED chip which includes electrical circuitry and one or more LEDs for serving as the light source for the headlamp assembly 20, for example. The LED chip shown has a series arrangement of five LEDs 38 in the example shown, but may include any number of one or more LEDs. The LED chip also has ribbon bond connecting pads 54 which serve as electrical circuit contact pads for connecting with ribbon bonds to receive electric power.

The second circuit component 40 is shown and described herein according to one example as an electrical connector that allows an electrical connection to be made to deliver electric power to the first circuit component 36. The second circuit component 40 is shown in FIGS. 3 and 4 having circuitry with circuit lines 42 and a connector module 46. The circuit lines 42 may be printed circuitry or wires, for example. The second circuit component 40 likewise includes ribbon bond connecting pads 56 to enable connection to the ribbon bonds to receive the electric power.

The circuit board assembly 30 further includes electrical circuit connectors in the form of concave ribbon bonds shown in one example having first and second concave ribbon bonds 50 and 52 extending between the first circuit component 36 and the second circuit component 40. The first and second concave ribbon bonds 50 and 52 are flat wire bonds having a width greater than a thickness and an elongated shape that is bent and arches downward with an arcuate concave shape between opposite ends. The ribbon bonds 50 and 52 may be made of an electrically conductive material such as aluminum, copper, silver or gold, for example. The first ribbon bond 50 has a first end 62 connected to the first circuit component 36 via a solder connection, rivets, clips or screws, for example, on one of the ribbon bond connecting pads 54 and a second end 64 connected to the second circuit component 40 via a solder connection, rivets, clips or screws, for example, on one of the ribbon bond connecting pads 56. The opposite ends of the first ribbon bond 50 may be connected to the corresponding ribbon bond connecting pads 54 and 56 via an electrical connector such as solder, for example.

The second ribbon bond 52 likewise has a first end 72 connected to the first circuit component 36 via a solder connection, rivets, clips or screws, for example, on one of the ribbon bond connecting pads 54 and a second end 74 connected to the second circuit component 40 via a solder connection, rivets, clips or screws, for example, on one of the ribbon bond connecting pads 56. The opposite first and second ends 72 and 74 of the second ribbon bond 52 may likewise be connected to the corresponding ribbon bond connecting pads 54 and 56 via an electrical connector such as solder, for example. The first and second ribbon bond connecting pads 54 and 56 are dielectrically isolated from each other.

The ribbon bonds 50 and 52 each are generally arcuate and have a concave shape extending downward between the first and second circuit components 36 and 40. The first ribbon bond 50 has a concave portion 60 located between the first and second ends 62 and 64. The concave portion 60 is shown in one example located approximately midway between first and second ends 62 and 64. The second ribbon bond 52 likewise has a concave portion 70 located between the first and second ends 72 and 74. The concave portion 70 is shown in one example located approximately midway between first and second ends 72 and 74. The ribbon bonds 50 and 52 generally extend through the space between the first and second circuit components 36 and 40 and are therefore exposed to the air.

A dielectric substrate 66 is further shown in one embodiment located below concave portions 60 and 70 and configured to provide an elevated platform to support the ribbon bonds 50 and 52 on the bottom side. The dielectric substrate 66 also prevents or reduces vibration. The ribbon bonds 50 and 52 extend downward and do not extend upward above the mounting pads of the first and second circuit components 36 and 40 and extend below the top surface of the first and second components 36 and 40, such that they may be less susceptible to contact and deformation during assembly and use. As such, the first and second ribbon bonds 50 and 52 have a U-shaped concave portion 70 that is lower than the higher of the first and second ends.

The circuit board 32 is further illustrated having fasteners 65 and 67, such as rivets for example, that extend through openings in the circuit board substrate and the second circuit component 40. The fasteners 65 and 67 fasten the second circuit component 40 onto the top of the circuit board 32 and also fasten the circuit board 32 onto the top of the heat sink 90.

By using concave ribbon bonds, the circuit component connections 36 and 40 between the first and second components are less prone to contact while the first and second circuit components 36 and 40 and electrical connections may be visible. For example, an imaging camera may be used to view the first circuit component 36 shown as the LED chip for quality control purposes to ensure that the wire bond connections and the LED chip are properly assembled and are in working condition.

The circuit board assembly 30 advantageously provides for concave ribbon bonds 50 and 52 that connect between first and second circuit components 36 and 40 and to prevent contact with the ribbon bonds 50. While the first circuit component 36 is shown electrically connected to an electrical connection as the second circuit component 40, the first or second circuit components 36 and 40 may be one or more of a diode, a capacitor, an inductor and an LED chip, for example. It should be appreciated that the circuit board assembly 30 is particularly advantageous for use on a motor vehicle 10 to provide for vehicle lighting, such as in a headlamp assembly and taillamp assembly.

It is to be understood that variations and modifications can be made on the aforementioned structure without departing from the concepts of the present disclosure, and further it is to be understood that such concepts are intended to be covered by the following claims unless these claims by their language expressly state otherwise.

What is claimed is:

1. A circuit board assembly comprising:
a circuit board having a circuit mounting surface;
a first circuit component mounted on the circuit mounting surface;
a second circuit component mounted on the circuit mounting surface; and
a first concave ribbon bond extending between the first and second circuit components, the first concave ribbon bond having a first width greater than a first thickness and having a first end connected to the first circuit component, a second end connected to the second circuit component and a first concave portion extending downward between the first and second ends of the first concave ribbon bond, wherein the first concave portion of the first concave ribbon bond extends below a top surface of the first circuit component and a top surface of the second circuit component.

2. The circuit board assembly of claim 1, further comprising a second concave ribbon bond having a second width greater than a second thickness and extending between the first and second circuit components, the second concave ribbon bond having a first end connected to the first circuit component and a second end connected to the second circuit component and a second concave portion extending downward between the first and second ends of the second concave ribbon bond.

3. The circuit board assembly of claim 2, wherein the second concave portion of the second concave ribbon bond extends below the top surface of the first circuit component and the top surface of the second circuit component.

4. The circuit board assembly of claim 1, wherein the first circuit component comprises a light emitting diode (LED) chip.

5. The circuit board assembly of claim 4, wherein the LED chip is provided in a vehicle headlamp.

6. The circuit board assembly of claim 1, wherein the first component comprises one or more of a diode, a capacitor, an inductor and an LED chip.

7. The circuit board assembly of claim 6, wherein the second component comprises an electrical connector module.

8. The circuit board assembly of claim 1, wherein the first and second ends of the first and second concave ribbon bonds are each connected with a solder connection.

9. The circuit board assembly of claim 1, wherein the circuit board comprises a printed circuit board.

10. The circuit board assembly of claim 9, further comprising a heat sink thermally coupled to the printed circuit board.

11. A vehicle lighting device comprising:
a lamp housing; and
a circuit board assembly disposed in the lamp housing, the circuit board assembly comprising:
a circuit board having a circuit mounting surface;
a first circuit component comprising an LED chip mounted on the circuit mounting surface;
a second circuit component mounted on the circuit mounting surface;
a first concave ribbon bond having a first width greater than a first thickness and extending between the first and second circuit components, the first concave ribbon bond having a first end connected to the first circuit component, a second end connected to the second circuit component and a first concave portion extending downward between the first and second ends of the first concave ribbon bond, wherein the first concave portion extends below a top surface of the first circuit component and a top surface of the second circuit component; and
a second concave ribbon bond having a second width greater than a second thickness and extending between the first and second circuit components, the second concave ribbon bond having a first end connected to the first circuit component and a second end connected to the second circuit component and a second concave portion extending downward between the first and second ends of the second concave ribbon bond, wherein the second concave portion extends below a top surface of the first circuit component and a top surface of the second circuit component.

12. The vehicle lighting device of claim 11, wherein the first circuit component comprises a light emitting diode (LED) chip.

13. The vehicle lighting device of claim 12, wherein the LED chip is provided in a vehicle headlamp.

14. The vehicle lighting device of claim 11, wherein the first component comprises one or more of a diode, a capacitor, an inductor and an LED chip.

15. The vehicle lighting device of claim 14, wherein the second component comprises an electrical connector module.

16. The vehicle lighting device of claim 11, wherein the circuit board comprises a printed circuit board.

17. The vehicle lighting device of claim 16, further comprising a heat sink thermally coupled to the printed circuit board.

\* \* \* \* \*